(12) United States Patent
de Kleer (10) Patent No.: US 7,962,321 B2
(45) Date of Patent: Jun. 14, 2011

(54) MODELING WHEN CONNECTIONS ARE THE PROBLEM

(75) Inventor: Johan de Kleer, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 874 days.

(21) Appl. No.: 11/775,650

(22) Filed: Jul. 10, 2007

(65) Prior Publication Data

US 2009/0018802 A1    Jan. 15, 2009

(51) Int. Cl.
*G06F 17/50* (2006.01)
(52) U.S. Cl. ............... 703/14; 703/6; 716/4; 702/183
(58) Field of Classification Search ............... 703/7, 14
See application file for complete search history.

(56) References Cited

U.S. PATENT DOCUMENTS

| | | | | |
|---|---|---|---|---|
| 5,187,773 | A * | 2/1993 | Hamilton et al. | 706/52 |
| 5,528,752 | A * | 6/1996 | Kise et al. | 714/29 |
| 5,732,192 | A * | 3/1998 | Malin et al. | 703/2 |
| 6,308,293 | B1 * | 10/2001 | Shimono | 714/741 |
| 6,343,261 | B1 * | 1/2002 | Iwanowski et al. | 702/183 |
| 7,120,563 | B2 * | 10/2006 | Bechhoefer et al. | 702/189 |
| 7,181,374 | B1 * | 2/2007 | Mosterman et al. | 703/2 |

OTHER PUBLICATIONS

Lee, Mark, "Many-Valued Logic and Qualitative Modelling of Electrical Circuits", In Proceedings 14th International Workshop on Qualitative Reasoning (QR-2000), 2000.*
de Kleer et al, "Diagnosis with Behavioral Models", Proceedings of the 11th International Joint Conference on Artificial Intelligence, vol. 2, pp. 1324-1330, 1989.*
Roos, Nico, "Efficient Model Based Diagnosis", Intelligent Systems Engineering,1993.*
Snooke, Neal, M2CIRQ: Qualitative Fluid Flow Modelling for Aerospace FMEA Applications, 21st International Conference on Qualitative Reasoning, Jun. 26-28, 2007.*
de Kleer et al, "Fundamentals of Model-Based Diagnosis", Proceedings of the 15th International Workshop on Principles of Diagnosis, 2004.*
Lee, Mark, "Qualitative Modeling of Linear Networks in ECAD Applications", Proceedings of the 13th International Workshop on Qualitative Reasoning, pp. 146-152, 1999.*
Feng et al, "Adaptive Algorithms for Maximum Diagnosis of Wiring Interconnects", IEEE Transactions on Computers, vol. 52, No. 10, Oct. 2003.*
Struss et al, "Qualitative Modeling is the Key to Automated Diagnosis", Proceedings 13th World Congress of IFAC, 1996.*
Lee et al, "Qualitative Modelling of Electrical Circuits", Sixth International Workshop on Qualitative Reasoning about Physical Systems, 1992.*

(Continued)

*Primary Examiner* — Jason Proctor
*Assistant Examiner* — Mary C Jacob
(74) *Attorney, Agent, or Firm* — Fay Sharpe LLP (57) ABSTRACT

A method and computer program product models connections for a system having a plurality of components, having component terminals, and connections. The connections are located to selectively connect the components of the system to each other. The method and computer product models signal levels for nodes of the system as a variable wherein the nodes of the system are representative of the connections. Each potential component terminal connection of the connections that could potentially influence the signal level on each of the nodes is modeled, as a qualitative variable. This results in each node of the system being modeled with n+1 variables.

23 Claims, 9 Drawing Sheets

OTHER PUBLICATIONS

De Kleer et al., "Diagnosing Multiple Faults", in Artificial Intelligence, 32(1):97-130, Apr. 1987, and also in Readings in NonMonotonic Reasoning, edited by Matthew L. Ginsberg, (Morgan Kaufmann, 1987), 280-297.

De Kleer et al., "Diagnosis with behavioral modes," in Proc. 11th IJCAI, pp. 1324-1330, Detroit, 1989.

De Kleer, et al., "Characterizing diagnoses and systems," in Artificial Intelligence, 56(2-3):197-222, 1992.

De Kleer, "A hybrid truth maintenance system," in PARC Technical Report, Jan. 1992.

Mauss, et al., "Towards model-based engineering: Failure analysis with mds," in Workshop on Knowledge-Based Systems for Model-Based Engineering, European Conference on AI (ECAI-2000, 2000.

Snooke, et al., "Challenges for qualitative electrical reasoning in automotive circuit simulation," in Proceedings 11th international workshop on Qualitative Reasoning, pp. 165-180, Cortona, Italy, Jun. 1997.

Raiman, et al., "Characterizing non-intermittent faults," in Proc. 9th National Conf. on Artificial Intelligence, pp. 849-854, Anaheim, CA, Jul. 1991.

Williams, et al., "Conflict-directed a* and its role in model-based embedded systems," in Journal of Discrete Applied Math, Special Issue on Theory and Applications of Satisfiability Testing, 2002.

Brglez et al., "Accelerated ATPG and Fault Grading Via Testability Analysis"; in Proc. IEEE Int. Symposium on Circuits and Systems, pp. 695-698, Jun. 1985.

Preist et al., "Modelling Bridge Faults for Diagnosis in Electronic Circuits", in Working Notes First International Workshop on Principles of Diagnosis, pp. 69-72, Stanford, 1990.

Struss et al., "Qualititative Modeling is the Key", in 6th Int'l Workshop on Principles of Diagnosis, Goslar, Germany, 1995.

Boettcher et al., "Hidden Interactions in analog circuits", in Working Papers of the Seventh International Workshop on Principles of Diagnosis, Suhayya Abu-Hakima, editor, pp. 36-43; Val Morin, Quebec, Canada, Oct. 1996.

Davis, "Diagnostic Reasoning Based on Structure and Behavior", Artificial Intelligence, Elsevier Science Publishers B. V., 1984, pp. 347-410.

* cited by examiner

| I/O | GATE | DRIVE |
|---|---|---|
| OUTPUT | G1 | d(0) |
| INPUT | G2 | d(R) |
| INPUT | G3 | d(R) |
| OUTPUT | G3 | d(1) |
| INPUT | G6 | d(R) |
| INPUT | G5 | d(R) |

FIG. 10

| I/O | GATE | DRIVE |
|---|---|---|
| DRIVEN | I4 | d(1) |
| INPUT | G1 | d(R) |
| INPUT | G4 | d(R) |
| OUTPUT | G1 | d(0) |
| INPUT | G2 | d(R) |
| INPUT | G3 | d(R) |

| I/O | GATE | DRIVE |
|---|---|---|
| DRIVEN | I5 | d(0) |
| INPUT | G4 | d(R) |
| OUTPUT | G6 | ? |

120

|  | I1 | I2 | I3 | I4 | I5 | N1 | N2 | N3 | N4 | O1 | O2 |
|---|---|---|---|---|---|---|---|---|---|---|---|
| I1 |  |  |  |  |  |  |  | S | S |  |  |
| I2 |  |  |  |  |  |  |  |  |  |  |  |
| I3 |  |  |  |  |  |  |  | S | S |  |  |
| I4 |  |  |  |  |  |  |  |  |  |  |  |
| I5 |  |  |  |  |  |  |  | S | S |  |  |
| N1 |  |  |  |  |  |  |  | S | S |  |  |
| N2 |  |  |  |  |  |  |  |  |  |  |  |
| N3 |  |  |  |  |  |  |  |  |  |  |  |
| N4 |  |  |  |  |  |  |  |  |  | S |  |
| O1 |  |  |  |  |  |  |  |  |  |  |  |
| O2 |  |  |  |  |  |  |  |  |  |  |  |

| CIRCUIT | COMPONENTS | NODES | 2-SHORTS | % |
|---|---|---|---|---|
| c17 | 6 | 11 | 9 | 7 |
| c432 | 160 | 195 | 638 | 5 |
| c499 | 201 | 242 | 562 | 6 |
| C880 | 384 | 442 | 4959 | 8 |

---
ALGORITHM 1: Basic A * search for diagnoses
---
begin
    $OPEN \leftarrow \{c_i = \phi\}$, $DIAGNOSES \leftarrow \emptyset$, $CONFLICTS \leftarrow \emptyset$
    while $OPEN \neq \emptyset$ do
        $n \leftarrow \arg\min_{x \in OPEN} f(x)$
        $OPEN \leftarrow OPEN \setminus \{n\}$
        if $\forall ng \in CONFLICTS\, ng \not\subseteq n$ then
            if $n$ assigns modes to all components then
                if $ng \leftarrow CONSISTENT(n)$ then
                      $CONFLICTS \leftarrow CONFLICTS \cup \{ng\}$
                else
                      $DIAGNOSES \leftarrow DIAGNOSES \cup \{n\}$
            else
                pick any $s = \phi \in n$
                $o \leftarrow n \setminus \{s = \phi\}$,
                foreach $f \in m(s)$ do
                      $OPEN \leftarrow OPEN \cup \{o \cup \{s = f\}\}$
end

MODELING WHEN CONNECTIONS ARE THE PROBLEM

BACKGROUND

The present application is directed to modeling systems which include components and connections between the components. More particularly, the application is concerned with the modeling of connections to enable identification of faults in the connections. In one embodiment such modeling may be accomplished by extending model-based diagnosis (MBD) to include reasoning about connection faults.

Components may be any of a number of objects depending on the particular system, e.g., circuit gates, transistors, pumps and motors, among others. Connections are the pathways between the components, including wires, pipes and shafts, to name a few. In the following discussion, a particular point of connection may be identified in this description as a node. Therefore, at times the words connection and node are used interchangeably herein.

Almost all approaches to diagnosis, both model-based and not, presume connections between system components are ideal. Unfortunately, connections often fail, and they fail in unforeseen ways. Two wires can short together, creating new circuit behavior. A pipe can leak such that there is a significant pressure drop where none was ever expected.

Early work on model-based diagnosis addressed bridge faults in systems. However, this early research treats shorts as a special case, hypothesizing bridge faults only when all single faults were eliminated. Another modeling approach which attempts to model shorts inserts additional insulating components at places where shorts may occur and uses stable-model semantics to identify candidate diagnoses. This approach is inefficient, as the number of possible insulator components to consider grows quadratically with system size. Still another procedure models structural shorts in analog systems, using the possibility of multiple faults to invoke an additional algorithm to match observed behavior to known hidden interaction models.

Other modeling techniques come from qualitative reasoning (QR) and model based diagnosis (MBD) work in automotive diagnosis and the failure modes and effects analysis (FMEA) construction domains. One methodology proposed in this area is to use multiple variables to represent wires.

As existing diagnostic reasoning approaches presume connections to be ideal most of these approaches model components but not their connections. For example, artificial intelligence (AI) diagnostic reasoning, for digital systems, presume that digital components can be modeled as pure functions of their inputs, all signals can be represented by "1"s and "0"s, wires between components cannot fail, and therefore do not model replacement of components or wires.

Even those modeling approaches that try to model connections try to model the possibility a connection can break, not that two connections may join, e.g., through fluid leakage or electrical short circuit. Among the reasons for this are that modeling these connection failures could require an exponential number of connection failure possibilities, and that modeling connection failures requires modeling the system at a level of precision which requires far more complex models.

None of the above assumptions are valid for the challenges diagnosticians encounter in real world systems. Also, although digital systems can be modeled at the analog level with programs such as SPICE or, at the digital/analog level, with VHDL-based simulators, they are not designed for diagnostic use, require accurate hard-to-obtain component models and do not present results in a way a human diagnostician can understand.

INCORPORATION BY REFERENCE

The disclosures of the patents/applications and articles listed below are each fully incorporated herein by reference.
"Hidden interactions in analog circuits," by C. Boettcher, P. Dague, and P. Taillibert, in *Working Papers of the Seventh International Workshop on Principles of Diagnosis*, Suhayya Abu-Hakima, editor, pages 36-43. Val Morin, Quebec, Canada, October 1996.
"A neutral netlist of 10 combinational benchmark circuits and a target translator in fortran," by F. Brglez and H. Fujiwara, in *Proc. IEEE Int. Symposium on Circuits and Systems*, pages 695-698, June 1985.
"Diagnostic reasoning based on structure and behavior," by R. Davis, in *Artificial Intelligence*, 24(1):347-410, 1984, and also in *Qualitative Reasoning about Physical Systems*, Bobrow, D. (ed.) (North-Holland, Amsterdam, 1984/MIT Press, Cambridge, Mass., 1985).
"Diagnosing multiple faults," by J. de Kleer and B. C. Williams, in *Artificial Intelligence*, 32(1):97-130, April 1987, and also in *Readings in NonMonotonic Reasoning*, edited by Matthew L. Ginsberg, (Morgan Kaufmann, 1987), 280-297.
"Diagnosis with behavioral modes," by J. de Kleer and B. C. Williams, in *Proc. 11th IJCAI*, pages 1324-1330, Detroit, 1989.
"Characterizing diagnoses and systems," by J. de Kleer, A. Mackworth, and R. Reiter, in *Artificial Intelligence*, 56(2-3):197-222, 1992.
"A hybrid truth maintenance system," by J. de Kleer in PARC Technical Report, January 1992.
*Readings in Model-based Diagnosis*, W. C. Hamscher, J. de Kleer, and L. Console, editors, Morgan Kaufmann, San Mateo, Calif., August 1992.
"Towards model-based engineering: Failure analysis with mds," by J. Mauss, V. May, and M. Tatar, in *Workshop on Knowledge-Based Systems for Model-Based Engineering, European Conference on AI (ECAI-2000*, 2000.
"Challenges for qualitative electrical reasoning in automotive circuit simulation," by N. A. Snooke and C. J. Price, in *Proceedings 11th international workshop on Qualitative Reasoning*, pages 165-180, Cortona, Italy, June 1997.
"Modelling bridge faults for diagnosis in electronic circuits," by C. Preist and B. Welham, in *Working Notes First International Workshop on Principles of Diagnosis*, pages 69-73, Stanford, 1990.
"Characterizing non-intermittent faults," by O. Raiman, J. de Kleer, V. Saraswat, and M. H. Shirley, in *Proc. 9th National Conf. on Artificial Intelligence*, pages 849-854, Anaheim, Calif., July 1991.
"Qualitative modeling is the key," by P. Struss, A. Malik, and M. Sachenbacher, in *6th International Workshop on Principles of Diagnosis*. Goslar, Germany, 1995.
"Conflict-directed a* and its role in model-based embedded systems," by B. C. Williams and J. Ragno, in *Journal of Discrete Applied Math, Special Issue on Theory and Applications of Satisfiability Testing*, 2002.

BRIEF DESCRIPTION

A method and computer program product models connections for a system having a plurality of components, having component terminals, and connections. The connections are located to selectively connect the components of the system to each other. The method and computer product models signal levels for nodes of the system as a variable wherein the nodes of the system are representative of the connections.

Each potential component terminal connection of the connections that could potentially influence the signal level on each of the nodes is modeled as a qualitative variable. This results in each node of the system being modeled with n+1 variables.

DETAILED DESCRIPTION

A key principle for model design is that models be veridical, directly linking causality with effect. Examples of non-veridical models are the "Stuck-at-0" and "Stuck-at-1" models commonly used for reasoning over digital circuits. "Stuck-at-1" could represent one of four possible faults: the driving gate's output is stuck at 1; some driven gate's input is stuck at 1; the wires are shorted to power; or the output is undriven and the signal floated to 1. In the veridical models related to this application all of these inferences are drawn from the particular model which is causing the malfunction—a wire, gate, or short. (in the following "wire" refers to any electrical connector). It is to be appreciated that in other systems, such as but not limited to mechanical systems, a connection may be a pipe, hose, or other conduit.

The present application describes a digital expert (DEX) that can reason over digital systems as an electrical engineer would: at a qualitative, causal level more accurate than the simple "0"/"1" level, but without incurring the costs of full-scale numerical algorithms. The following discussion describes a more powerful approach to modeling connections which does not require special-case post-processing and is computationally tractable. The approach is presented in the context of digital systems, although it is to be understand its use is not limited thereto.

1. Overview

Figure 1:
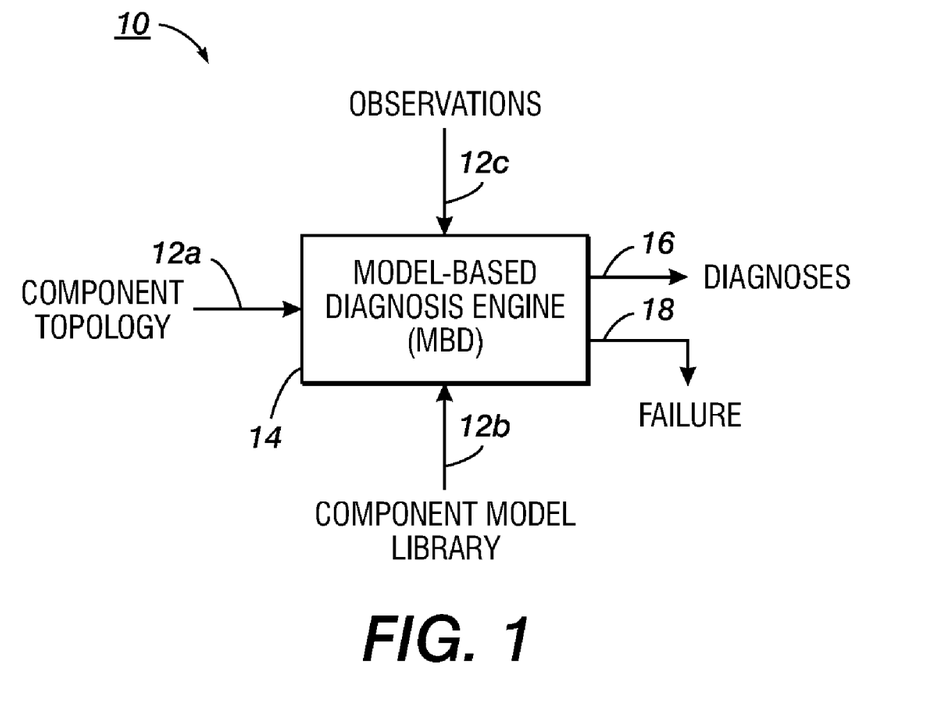
FIG. 1 illustrates the basic architecture of a model-based diagnosis engine.

In one embodiment, the concept may be implemented in a model-based framework, such as represented in FIG. 1 which characterizes the basic architecture of a model-based, component-based diagnosis (MBD) engine architecture 10. Given the component topology (e.g., the schematic for a digital circuit) 12a, component models (e.g., resistors obey ohm's law) 12b and observations (e.g., the voltage across resistor R6 is 4 volts) 12c, model-based diagnosis (MBD) engine 14 computes diagnoses 16 which explain all the observations 12c. Observations inconsistent with expectations guide the discovery of diagnoses. When the model-based diagnosis (MBD) engine can find no diagnoses it signals a failure 18.

Figure 2:
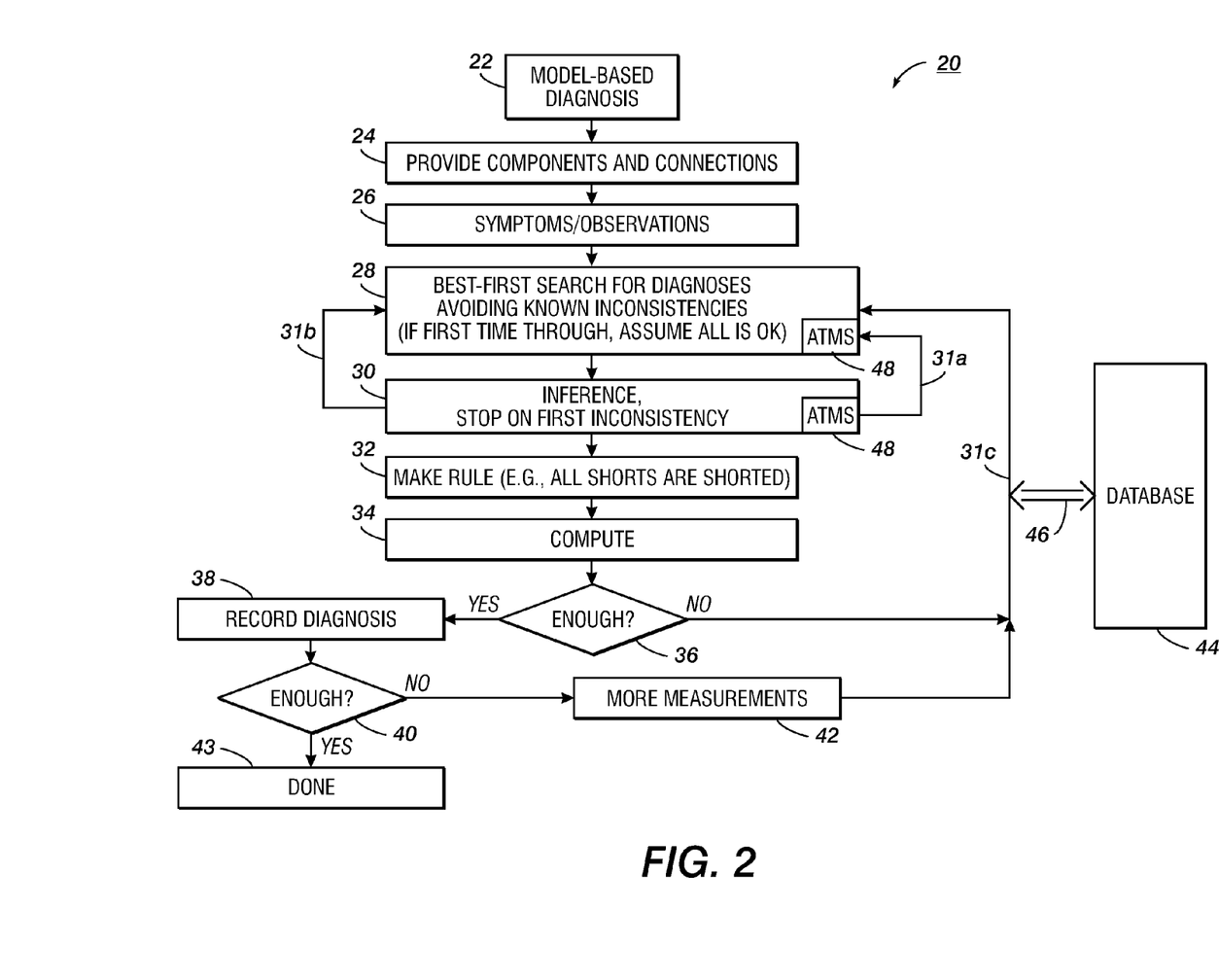
FIG. 2 illustrates a flow diagram directed to the concepts of a system and method which efficiently diagnoses non-intermittent faults in simple and complex systems.

Turning to FIG. 2, presented is a flow diagram directed to an overview of a system and method which efficiently diagnoses faults, including faults in connections between components. In flow diagram 20 of FIG. 2, a model-based diagnosis system 22 is formulated. Components and connections are provided to the MBD system 24. In step 26, observations of the "real world" system having potential faults, and the corresponding model of that system are observed. These "real world" observations may in one instance be obtained by probing the circuit via a probing device such as known in the art (e.g., a volt meter, current tester, logic analyzer, high-speed camera).

Then in step 28, a best first search diagnoses is undertaken, avoiding known inconsistencies of the system. If this is the first pass going through the process it is assumed all is "OK" and the system is functioning normally.

Next, moving to step 30, and knowing certain inputs, predictions of the model are made using inferences generated, for example, by a known inference engine. When an inconsistency is found the inference operations are stopped and the process moves to step 32, where a rule is made (In one example, the new rule will be that all nodes in the shorted mode are shorted to each other. This concept will be more fully understood upon a reading of the remainder of this document). The new rule is placed into the system back at step 30, via line 31a. The process then moves back to best-first search step 28 via line 31b, and then back to step 30, where the processing is continued with the newly incorporated rule.

This process will continue until no inconsistencies are found. When in step 30 no inconsistencies are found the process moves through step 32 (i.e., no new information), to step 34, where probabilities are computed for the components and/or connections, and the system diagnosis is computed. To increase the accuracy of the obtained probabilities with the diagnosis, Bayes' rule may be applied.

In step 36, an inquiry is made as to whether sufficient candidate diagnoses have been found. This "Enough" inquiry may be directed to something as simple as some particular diagnosis having a sufficiently high posterior probability or the number of candidate diagnoses found. When sufficient candidate diagnoses have not been found (NO), the process moves back to step 28, via line 31c. However, when sufficient candidate diagnoses have been found (YES) they are recorded, step 38, and a second "ENOUGH" inquiry, step 40, is made to determine whether a unique diagnosis can be identified from among the candidate diagnoses or whether more measurements are needed, i.e., the process moves to step 42.

More particularly, if step 40 indicates there has not been "Enough", e.g., the operation has not reached the number of measurements or probes that are determined to be the maximum is not greater than a determined threshold, the process moves to step 42, where a next placement of the measurement or probing location is determined and undertaken. In one example, this would simply mean moving a probing device (e.g., from the input of a device A to the output of a device B). Once the new measurement or probing place has been selected, and the measurements have been obtained, the process moves back, from step 42, to step 28 via line 31c, and the process is repeated. If in step 40 a unique diagnosis can be made the process is done, step 43.

Also shown in FIG. 2 is a database 44. It is to be appreciated the system shown in flow diagram 20 may be implemented in a computing device, either particularly built for MBD operations to diagnose faults, or any other general computing device. Such devices will have storage elements such as defined by database 44. As can be seen by arrows 46, the intent is to emphasize that the information used and generated by the various modules or steps in flow diagram 20 can be stored at memory locations within database 44. Also shown in FIG. 2 is that ATMS 48 is used as part of the process.

Thus, FIG. 2 shows steps of a system and method (e.g. an extension of the MBD) which permits the modeling of signals in connections, such as wires, pipes, etc., by representing causality for component behaviors. A particular aspect of diagram 20 in relationship to the concepts of the present application is in step 32 which includes making a rule. As part of this step, the connections may be thought of in a manner different than that in existing approaches.

Figure 3:
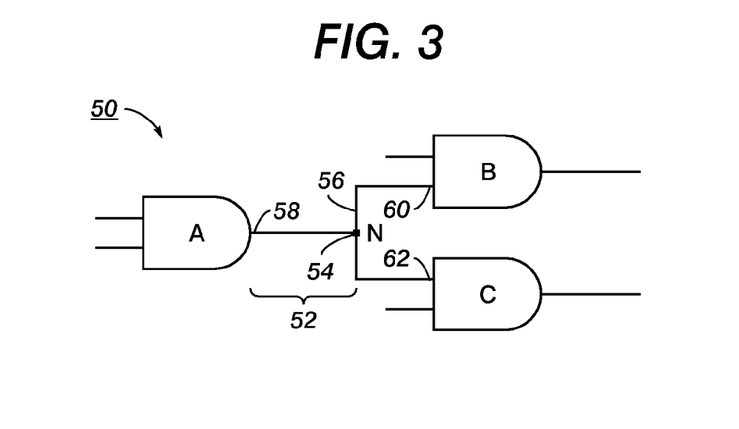
FIG. 3 is a diagram illustrating that instead of only modeling a node N with one signal 0 or 1, each potential connection is modeled which could possibly influence the signal level on the node with a qualitative variable. Each circuit node is modeled with n+1 variables, one for the final signal level, and one for each of the n component terminals connected to it.

Particularly, as shown in block diagram 50 of FIG. 3 instead of modeling a connection 52 with a "1" or "0," each potential connection is modeled which could possibly influence the signal level on the node with a qualitative variable. Each circuit node is modeled with n+1 variables. Connection 52 is represented by node N (54) in this example. One variable of the connection 52 indicates the signal level 56 of node N (54), while other variables represent each of the n component terminals connected to it, e.g., the causal drivers 58, 60 and 62 of the node N (54). Consequently, opens and shorts can be directly modeled, component models can be causally accurate and devices which explicitly determine whether to drive outputs can be modeled as well (such as tri-state and open-collector components). Causal driver 58, is the causal effect of the gate A terminal on node N, which is typically used to drive the signal at Node N towards 1 or 0. Causal driver 60, is the causal effect of the gate B terminal on node N, which is typically a high passive resistive load which does not influence the signal at node N. Causal driver 62, is the causal effect of the gate C terminal on node N, which is typically a high passive resistive load which does not influence the signal at node N.

This disclosure demonstrates the present concepts primarily on a variety of circuits from the known standard test suite ISCAS-85. All ISCAS-85 benchmark (up to 3512 components) circuits can be modeled and diagnosed efficiently (<1 minute on a modern PC). Previous work on shorts and bridge faults, such as discussed in the Background of this document, presumed considering all possible shorts to be computationally unreasonable and introduced special-case inference procedures to handle them. The following discussion shows however that extremely few possible shorts (and/or other faults) can explain typical symptoms, and those that do are a small fraction of the possible diagnoses. Thus, model-based diagnosis (MBD) systems containing shorts (and/or other faults) can be generated within the framework of existing algorithms using the concepts/models presented herein.

The digital expert (DEX) system described here utilizes an implementation of the known GDE/Sherlock probabilistic framework based on the Hybrid Truth Maintenance System (HTMS). A GDE is a General Diagnostic Engine, and a GDE/Sherlock is a particular version or extension of a GDE approach. More details of these known approaches are provided in the following sections.

Components and models are compiled (individually, not in combination) to their prime implicates with unmeasurable internal variables eliminated. The primary inference mechanism is local constraint propagation (also called consistency, consistency enforcing, Waltz, filtering or narrowing algorithms) where completeness (for conflicts and value propagation) is ensured though the introduction of additional assumptions for unassigned measurable variables, propagating these and subsequently using propositional resolution to eliminate the ambiguities.

The present description also makes the following simplifications for ease of discussion, but which are not considered required for implementation of the present concepts:

Components behave non-intermittently. Later in this discussion the definition of non-intermittency will be generalized from that which is generally known, for example, a component behaves non-intermittently if its outputs are a function of its inputs. As the models in this disclosure allow causality to change, inputs and outputs are no longer well-defined.

No causal loops in the combinatorial logic.

No logical memory elements.

No model of transient behavior. All signals are presumed to have reached quiescence after the input vector has been applied. Thus DEX cannot reason about hazards, race conditions, or situations in which a node's value switches too slowly because it is not driven with enough current or there are too many loads connected to it.

No fault propagation. A fault in one component cannot cause a fault in another.

A contribution of the concepts described herein is a powerful approach to modeling connections which does not require special-case post-processing and is computationally tractable. Only one additional component needs to be added to model each node, so the number of additional node components grows linearly in the worst-case. This approach provides a way to model situations where causality changes such as short circuits, open circuits, and tri-state, open-collector, and expand gates. Structural faults are modeled as any other fault and are integrated within a GDE/Sherlock approach to measurement selection and component replacement policies. Most of the potential computational complexity introduced by the more detailed causal models is avoided by searching for candidate diagnoses in best-first order. Candidates are ordered by their posterior probabilities, not the number of faults they contain.

2 Framework

In one embodiment, the basic framework in which the present concepts may be implemented is through the use of the mentioned General Diagnostic Engine (GDE) framework, which includes having the behavior of components expressed as constraints, predicate calculus, or as conventional rules. GDE can use an Assumption-Based Truth Maintenance System (ATMS) to record all the conclusions it draws from these models and the observations.

GDE computes a probability for each candidate diagnosis. Given component failure probabilities and assuming components fail independently, GDE assigns a prior probability to each diagnosis. As observations accumulate the (posterior) probabilities of diagnoses shift according to Bayes' rule. Candidate diagnoses which are logically eliminative by the evidence receive probability 0. Although GDE uses a consistency-based definition of diagnosis (as opposed to an abductive definition), applying Bayes' rule drives up the probabilities of those diagnoses that entail the observation compared with those that are just consistent with it. As a consequence, its use of Bayes' rule to update probabilities results in GDE exhibiting a synthesis of the properties of consistency-based diagnosis and of abduction-based diagnosis.

To determine what is actually wrong with a system usually requires obtaining additional measurements. In one embodiment, GDE performs sequential diagnosis by choosing the best measurement to make next. It commonly uses a one-step look-ahead function based on minimum entropy (e.g., a myopic minimum entropy strategy). GDE proposes a set of measurements to make which will, on average, require a minimum number of measurements to localize the correct diagnosis.

An Assumption-based Truth Maintenance System (ATMS) and Hybrid-Truth Maintenance System (HTMS) framework involves, a propositional inference engine designed to simplify the construction of problem solvers that search complex search spaces efficiently. The ATMS represents problem states with assumptions, which correspond to primary binary choices, and nodes, which correspond to propositions whose truth is dependent on the truth of the assumptions. Dependency relationships among assumptions and nodes are determined by a domain-specific problem solver such as a conventional inference engine. The problem solver presents these relationships to the ATMS as clauses justifications. The ATMS determines which combinations of assumptions are consistent and identifies the conclusions to which they lead.

The ATMS is conventionally utilized by combining it with a conventional inference engine appropriate to the problem being solved. The extension of the present concepts includes a propositional reasoner and an interface that receives calls from the inference engine, passes them to the propositional reasoner, and returns results to the inference engine.

In a framework such as above, the following is understood:

Definition 1: A system is a triple (SD, COMPS, OBS) where:

1. SD, the system description, is a set of first-order sentences.
2. COMPS, the system components, is a finite set of constants.
3. OBS, a set of observations, is a set of first-order sentences.

Definition 2: Given two sets of components Cp and Cn define D(Cp,Cn) to be the conjunction:

$$\left[\bigwedge_{c \in C_p} AB(c)\right] \wedge \left[\bigwedge_{c \in C_n} \neg AB(c)\right].$$

Where AB(x) represents that the component x is ABnormal (faulted).

A diagnosis is a sentence describing one possible state of the system, where this state is an assignment of the status normal or abnormal to each system component.

Definition 3: Let $\Delta \subset$ COMPS. A diagnosis for (SD, COMPS,OBS) is $D(\Delta, \overline{COMPS} - \Delta)$ such that the following is satisfiable:

$$SD \cup OBS \cup \{D(\Delta, COMPS - \Delta)\}$$

Figure 4:
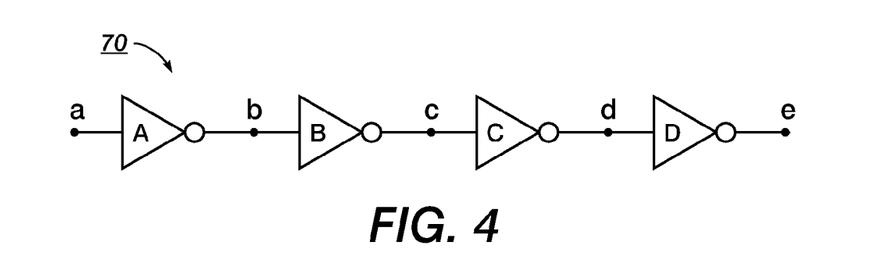
FIG. 4 shows four sequential inverters.

In this framework, a typical general model for an inverter (such as an inverter of four inverter string 70, having inverters A-D) is:

$$INVERTER(x) \rightarrow [\neg AB(x) \rightarrow [in(x, t) = 0 \equiv out(x, t) = 1]].$$

(assuming the appropriate domain axioms for variables)

More particularly, as one example, the model for the second inverter (B) of FIG. 4 is:

$$[\neg AB(B) \rightarrow [in(B,t)=0 \equiv out(B,t)=1]].$$

3 Causality

Models of the type described in the previous section implicitly assume that components have distinguished input terminals that only sense their inputs and then cause an output variable value. Both of these assumptions can be faulty. For example, in FIG. 4, the input of inverter (B) can be shorted to ground internal to the gate. In this case, despite a 1 signal from the first inverter (A), node b would be measured to be 0. If node a=0, then the classic models would dictate the first inverter (A) is faulted, when in fact it is actually the second inverter (B) that is faulted.

To model causality more accurately, wires must be modeled with more accuracy. In this embodiment each terminal of a component is modeled with two variables, one which models how the component is attempting to influence its output (roughly analogous to current), and the other which characterizes the result (roughly analogous to voltage). For a correctly functioning node, these voltage-like variables are equal. There are five, mutually inconsistent, qualitative values for the influence of a component on a node (these are referred to as "drivers"):

d(−∞) indicates a direct short to ground.

d(0) pull towards ground (i.e., 0).

d(R) presents a high (i.e., draws little current) passive resistive load.

d(1) pull towards power (i.e., 1).

d(+∞) indicates a direct short to power.

Intuitively, these five qualitative values describe the range of possible current sinking/sourcing behaviors of a component terminal. A direct short to ground can draw a large current inflow. A direct power to ground can drive a large current outflow.

There are provided three possible qualitative values for the result variable:

s(0) the result is close enough to ground to be sensed as a digital 0.

s(x) the result is neither a 0 or 1.

s(1) the result is close enough to power to be sensed as a digital 1.

Different logic families will have different thresholds for determining s(0) or s(1). For example, the voltage (v) levels for conventional TTL components are: s(0) corresponds to $v \leq 0.8$, s(1) to $v \geq 2.4$ and s(x) to $0.8 < s(x) < 2.4$. s(x) only arises when measurements are made and is never used within a component model. If some needed component input has been measured to be s(x), its output is not determined by the model (i.e., can be s(0), s(x) or s(1)).

With few exceptions, correctly functioning digital devices present a high (little current drawing) resistive load on all their inputs and drive all their outputs. Unless otherwise noted these axioms will be included in every component model. Every output drives a signal (except in special cases described later):

$$\neg AB(x) \rightarrow [d(\text{out}(x,t)) = d(0) \lor d(\text{out}(x,t)) = d(1)].$$

Every input presents a resistive load:

$$\neg AB(x) - d(\text{in}(x,t)) = d(R).$$

Under this modeling regime, an inverter is modeled as follows:

$$\text{INVERTER}(x) \rightarrow [\neg AB(x) \rightarrow [s(\text{in}(x, t)) = s(0) \rightarrow d(\text{out}(x, t)) =$$
$$d(1) \land s(\text{in}(x, t)) = s(1) \rightarrow d(\text{out}(x, t)) = d(0) \land d(\text{in}(x, t)) =$$
$$d(R) \land d(\text{out}(x, t)) = d(0) \lor d(\text{out}(x, t)) = d(1)]].$$

Under the usual modeling regime, there is no need to model the behavior of nodes (i.e., connections) as they just pass along their signals. However, in the present embodiment explicit models are needed to describe how the sensed digital value of the node is determined from its drivers. In the following, R(v) is the resulting signal at node v and S(v) is the collection of drivers of node v. For example, in FIG. 4, S(b)={d(out(A, t), d(in(B, t)}, where "t" is time, "out" is output and "in" is input. Nodes are modeled as follows (sometimes referred to as 0-dominant models):

If $d(-\infty) \in S(v)$, then R(v)=s(0).
If $d(+\infty) \in S(v)$, then R(v)=s(1).
If $d(\mathbf{0}) \in S(v)$, then R(v)=s(0).
Else, if all drivers are known, and the preceding three rules do not apply, then R(v)=s(1).

For example, node b of FIG. 4 is modeled as follows:

$$\neg AB(b) \rightarrow [d(\text{out}(A, t)) =$$
$$d(-\infty) \rightarrow s(b) = s(0) \land d(\text{in}(B, t)) = d(-\infty) \rightarrow s(b) =$$
$$s(0) \land d(\text{out}(A, t)) = d(+\infty) \rightarrow s(b) = s(1) \land d(\text{in}(B, t)) =$$
$$d(+\infty) \rightarrow s(b) = s(1) \land d(\text{out}(A, t)) = d(0) \rightarrow s(b) =$$
$$s(0) \land d(\text{in}(B, t)) = d(0) \rightarrow s(b) = s(0) \land$$
$$[d(\text{out}(A, t)) = d(1) \land d(\text{in}(B, t)) = d(1) \rightarrow s(b) = 1] \land [$$
$$d(\text{out}(A, t)) =$$
$$d(1) \land d(\text{in}(B, t)) = d(R) \rightarrow s(b) = 1] \land [d(\text{out}(A, t)) =$$

-continued $$d(R) \land d(\text{in}(B, t)) = d(R) \rightarrow s(b) = 1] \land [$$
$$d(\text{out}(A, t)) = d(R) \land d(\text{in}(B, t)) = d(1) \rightarrow s(b) = 1]]$$

The foregoing has laid the groundwork for a new definition of non-intermittency, remembering the present definition in this art is:

Definition 4 A component behaves non-intermittently if its outputs are a function of its inputs.

This definition succinctly captures the intuition of non-intermittency: (1) a component has exactly one output value for a particular set of input values, (2) even though other circuit values may change, the same inputs yield the same outputs, (3) the inputs are clearly identified—so no "hidden" input can be effecting the output value. These same intuitions are used for the new non-intermittency definition (Definition 5), except that the notion of "input" and "output" is changed.

Definition 5 The causal inputs to a component are the signal levels at all the system (e.g., circuit) nodes the component is connected to. The causal outputs of a component are the driving signals on all of the connections (wires, pipes, etc.) of the nodes to which the components connect. A component is causally non-intermittent if all its driving outputs are a function of its sensed inputs.

Under this definition, a "two-input And-gate" has three sensed inputs and three driven outputs. This general definition captures all possible faults of the two-input And-gate including such extreme possibilities of installing the wrong gate or installing it backwards. Correctly functioning components will drive all their outputs, but most will not reference the signal level on its teleological output (what the logic designer would call the "output").

Figure 5:
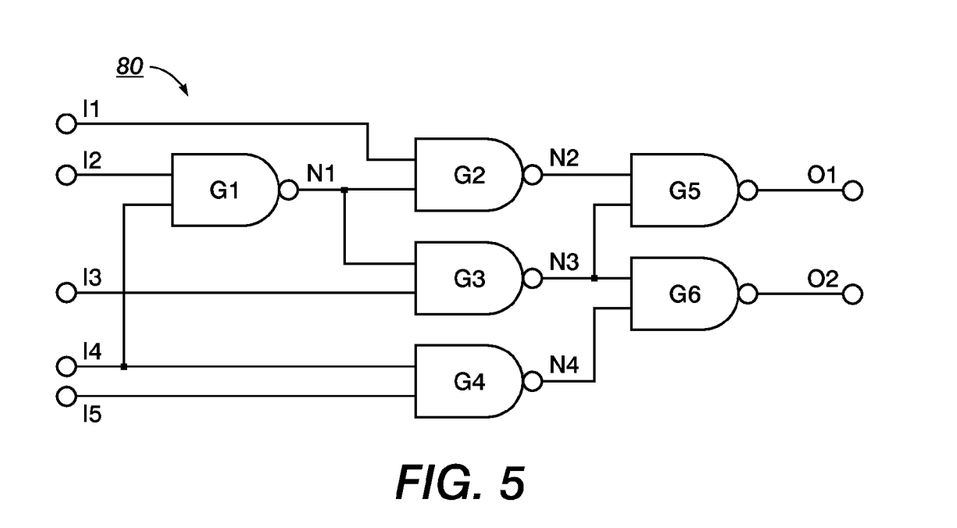
FIG. 5 depicts the simplest circuit, c17, from the ISCAS-85 test suite, with inputs being labeled "In," outputs "On," gates "Gn," and corresponding internal nodes "Nn."
Figure 6:
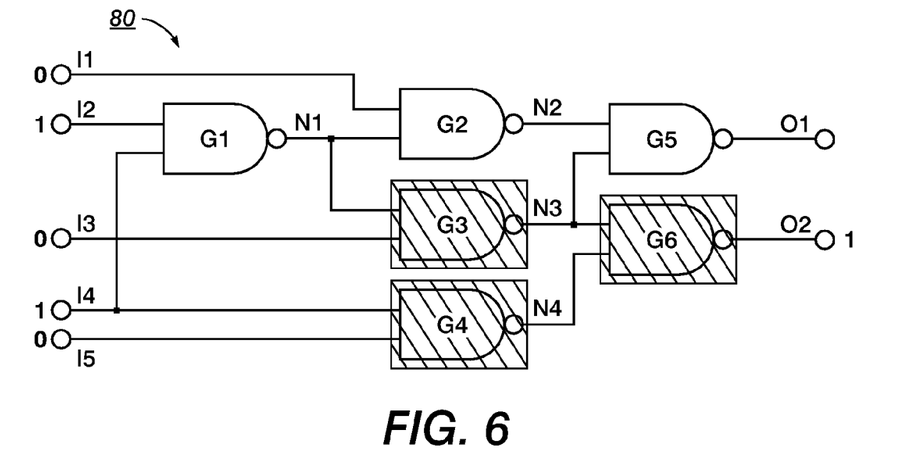
FIG. 6 depicts the circuit of FIG. 5 with inputs and symptom added. Output O2 should be "0" but is measured to be "1". All components fail with equal prior probability. After observing the symptom, the more likely faulted gates are G3, G4 and G6 (which are highlighted).

Considering the slightly more complex circuit 80 of FIG. 5—the simplest examples in the ISCAS-85 test suite. Circuit 80 includes inputs (I1-I5), gates (G1-G6) and outputs (O1, O2). Also designated are some of the nodes (N1-N4) of the circuit. Suppose a test vector (I1=0, I2=1, I3=0, I4=1, I5=0) is applied and O2 is measured to be 1 (correct is 0). FIG. 6 highlights the only component (G3, G4, G6) single faults under the simple GDE models that could be responsible. When node models according to the present application are included, G5 is the only node single fault with its input stuck to ground. Therefore, in FIG. 7 gate G5 is also highlighted as possibly faulted.

Figure 8:
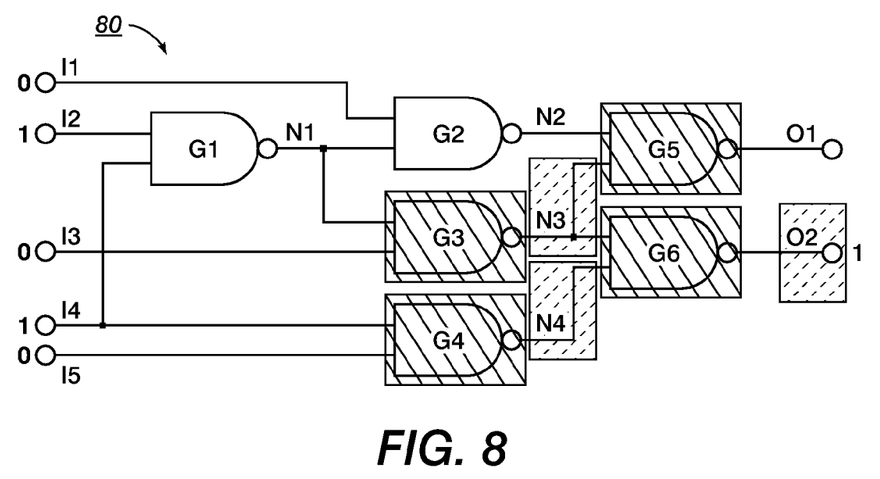
FIG. 8 illustrates modeling nodes as possibly faulted components. The highlighted components are more likely to be faulted given the observations. Component faults (in darker shading) are more likely than connection faults (in lighter shading). Lower probability components and nodes are not shaded. Prior fault probabilities of components are all equal, as are the component probabilities (in this case with higher priors).

In order to model nodes which can fail, all nodes are modeled as components with the same model concepts described earlier. For example, FIG. 8 highlights the more probable node (N3, N4) and component faults (G3, G4, G5, G6), along with the faulted output O2. The highlighted components are more likely to be faulted given the observations. Component faults (in darker shading) are more likely than connection faults (in lighter shading). Lower probability components and nodes are not shaded. Prior fault probabilities of components are all equal, as are the component probabilities (in this case with higher priors).

4 Bridges and Shorts

Having laid out the causal modeling paradigm the extension needed to model bridges and shorts is relatively straightforward. One fault mode is added to the model of a node. A node can either be in mode & (working correctly $\neg$ AB (i.e., not Abnormal)), S for shorted or U (unknown or no model). For every node:

$$AB(n) \rightarrow S(n) \odot U(n).$$

Where the G model is unchanged from that described earlier (and the $\odot$ symbol represents exclusive or). There are two additional nodes, power and ground whose output drivers are d(−∞) and d(+∞) to model shorts to power and ground.

Each of the nodes in a shorted set will have the same signal level, which is determined as if the combined node were functioning in an overall G mode. For example, consider the candidate diagnosis of circuit c17 of FIGS. 5-8 in which N1 and N3 are shorted together and all other components and nodes function correctly. Table 90 of FIG. 9 lists the drivers of the combined node, and by the node-model this will produce a signal at N3 of 0 which propagates through G6 to produce 1 which is the observed symptom. Therefore, a N1-to-N3 short is a candidate diagnosis which explains all the symptoms.

Figure 9:
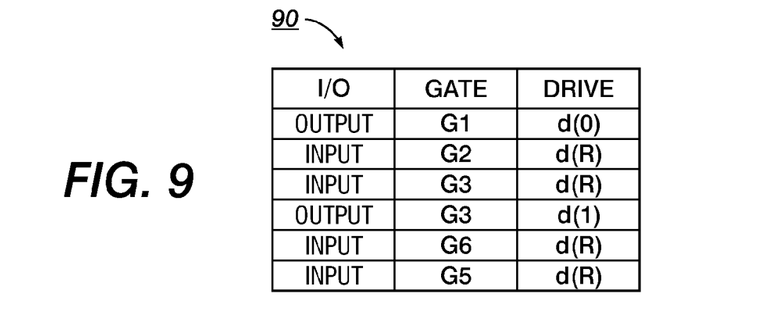
FIG. 9 is a Table showing combined drivers of nodes N1 and N3.

Notice the only possible short with node O2 which explains the symptom is a short to power (assuming all other components and nodes are working correctly). As the output driver of G6 is d(1) it cannot pull up any 0 node.

Figure 10:
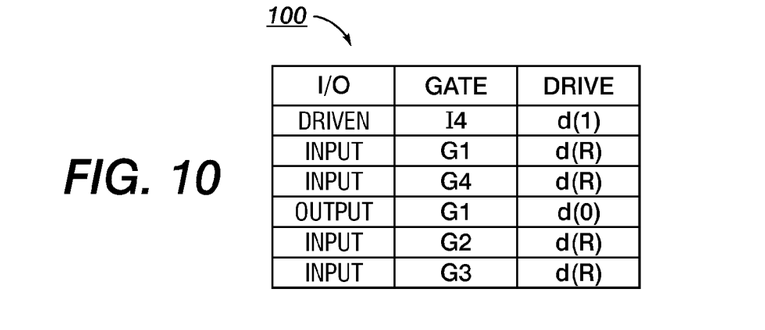
FIG. 10 is a Table showing combined drivers of nodes I4 and N1.

Most combinations of shorts make no causal sense and these are eliminated as a consequence of the models of the present application (no additional machinery is required). A trivial instance of a nonsensical short is between nodes I4 and N1. The drivers of this combined node are listed in Table 100 of FIG. 10. So, the signal at the combined node I4-N1 will become 0, which produces an inconsistency with the correct model of the nand gate G1 and will not be considered a possible short (again assuming all other components and nodes are working correctly). If this short had happened in a physical circuit, the circuit would probably oscillate. As oscillation is not being modeled, the inconsistency will guarantee that no candidate diagnosis will include the I4-N1 short.

Figure 7:
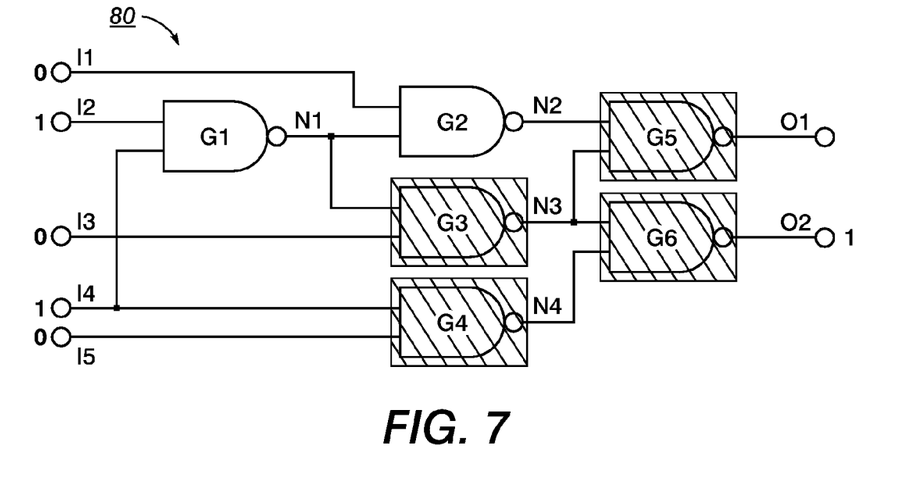
FIG. 7 used the expanded node model, with gate G5 could have its input shorted to ground causing the symptom at O2 (0 is the expected value, but 1 is measured). The likely faulted gates are now G3, G4, G5 and G6.
Figure 11:
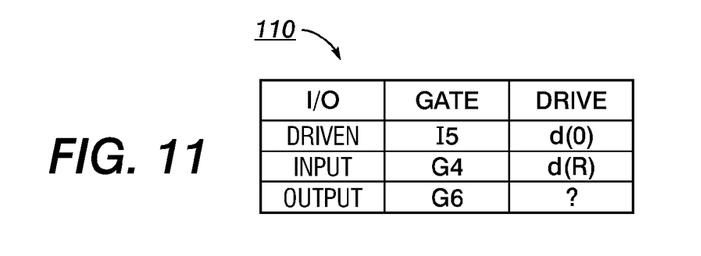
FIG. 11 is a Table showing combined drivers of nodes I5 and O2.

Finally, consider the case where the nodes I5 and O2 are shorted (with same observations of FIG. 7). The drivers of the combined node are listed in Table 110 of FIG. 11. Gates G4 and G6 appear to be in a loop. Thus the signal levels on nodes I5, N4 and O2 cannot be determined by only considering the driver values. Fortunately, the nand model for G6 resolves the ambiguity:

$$\neg AB(G6) \rightarrow [d(\text{out }(G6, t)) = d(0) \vee d(\text{out }(G6, t)) = d(1)].$$

Figure 12:
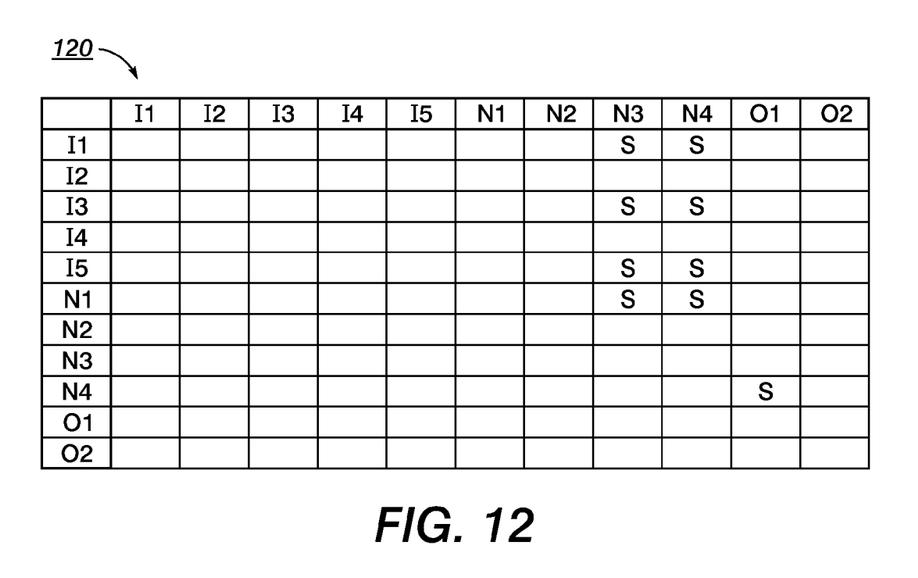
FIG. 12 is a Table, with the upper diagonal of the matrix giving the only possible two node shorts for the c17 example which explain the symptoms. Shorts to ground and power are not included.

Thus the output driver of G6 cannot be d(+∞) and thus it can be immediately inferred that shorting I5 and O2 does not explain why O2 is observed to be 1 instead of 0. The only shorts which explain the symptom are shown in Table 120 of FIG. 12, with the upper diagonal of the matrix giving the only possible two node shorts for the c17 example which explain the symptoms. For brevity, nodes are indicated by their integers. Shorts to ground and power are not included. It is interesting to note the majority of possible shorts are ruled out by just measuring one output signal. Only 9/66 of the possible shorts explain the evidence.

Figure 13:
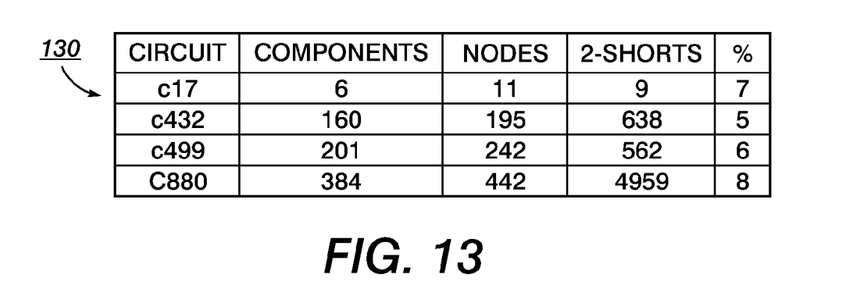
FIG. 13 is a Table showing the number of possible shorts of two nodes for a typical symptom for the worst-case where all two shorts are equally likely. The percentages characterize how many of all possible two or smaller candidates are node shorts. All circuits come from the ISCAS-85 test suite. c432 is a 27-channel interrupt controller, c499 is a 32-bit single-error-correcting-circuit, and c880 is an 8-bit arithmetic logic unit.

As seen in circuit c17 of FIGS. 5-8, surprisingly few shorts explain the observations that have been collected on the circuit. Table 130 of FIG. 13 shows that, as compared to all possible candidates which explain the symptoms, the percentage of shorted node candidates is relatively small. Particularly, Table 130 shows that the number of possible shorts of two nodes for a typical symptom for the worst-case where all two shorts are equally likely. The percentages characterize how many of all possible two or smaller candidates are node shorts. All circuits come from the ISCAS-85 test suite. c432 is a 27-channel interrupt controller, c499 is a 32-bit single-error-correcting-circuit, and c880 is an 8-bit arithmetic logic unit.

5 Tri-State and Open-Collector Devices

Figure 14:
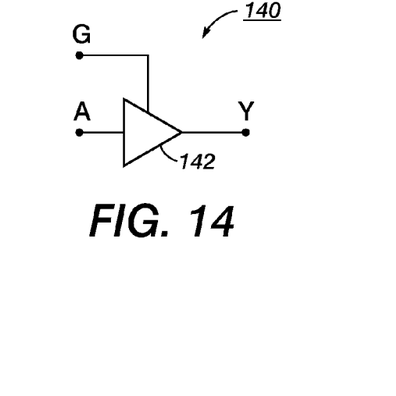
FIG. 14 shows a Tri-state Buffer.

With a modeling paradigm which distinguishes signal levels from drivers, it becomes possible to model a tri-state device (not possible when modeling gates as purely digital, such as shown by circuit 140 of FIG. 14, which includes gate 142). When G=1 in FIG. 14, gate 142 acts as any other buffer. However, if G=0, the tristate output only presents high resistive load at its output no matter the value of input A (an exception to the usual output driver):

$$TRISTATEBUF(x) \wedge \neg AB(x) \rightarrow [$$
$$s(G(x, t)) = s(1) \rightarrow [s(A(x, t)) = s(0) \rightarrow d(Y(x, t)) =$$
$$d(0) \wedge s(A(x, t)) = s(1) \rightarrow d(Y(x, t)) = d(1) \wedge d(Y(x, t)) =$$
$$d(0) \vee d(Y(x, t)) = d(1)]] \wedge d(A(x, t)) =$$
$$d(R) \wedge d(G(x, t)) = d(R) \wedge G(s(x, t)) = s(0) \rightarrow d(Y(x, t)) = d(R).$$

Open-collector devices do not need an additional model as these are 0-dominant as well. Without an external pull-up resistor these lines rise slowly to their signal level but DEX does not yet model this transient behavior.

6 IC Components

Figure 15:
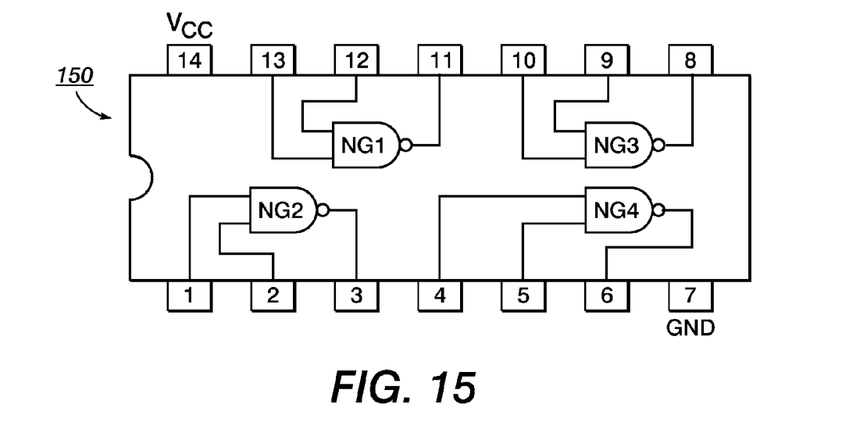
FIG. 15 depicts 7400.

The system and method which has been described can be used to analyze a system to the gate level. However, in many cases the system is composed of integrated circuits that each contain many gates, and troubleshooting need only identify the faulty IC. FIG. 15 is the well known 7400 IC, 150, which contains four two-input nand gates (NG1-NG4). Intuitively, it looks like a single AB-literal can be used for the IC and all the nand-models depend on its negation. This has two problems. First, the extension to fault models is cumbersome. If an individual nand gate with three faults (e.g., SA0, SA1, U) is modeled, then the IC 150 of FIG. 15 would have 255 fault modes. Second, the ability to propose measurements is impeded because four components are removed when considering the IC faulty. Therefore, a DEX according to the present concepts, models all ICs with sets of prime implicates containing only IC terminal variables and the one IC AB-literal, and simply replaces these clauses with individual gate AB-literals and associated clauses whenever the IC AB-literal occurs in any candidate leading diagnosis.

IC components present a second challenge to models generated according to the present embodiments. Consider the 7451 IC, 160, of FIG. 16. It contains two distinct sets of gates which compute And-Or-Invert of their inputs. And gates A1, A2 and exclusive Or gate X or 1; and And gate A3, A4 and exclusive Or gate X or 2. Both of these functions could be modeled with one AB-literal as done for the 7400 IC, 150, of FIG. 15. A wire bond from the semiconductor die could short with some other internal metal trace, or two metal traces could short. For example, the output of one of the And-gates of the first And-Or-Invert logic could short with the output of an And-gate of the second And-Or-Invert logic.

Figure 16:
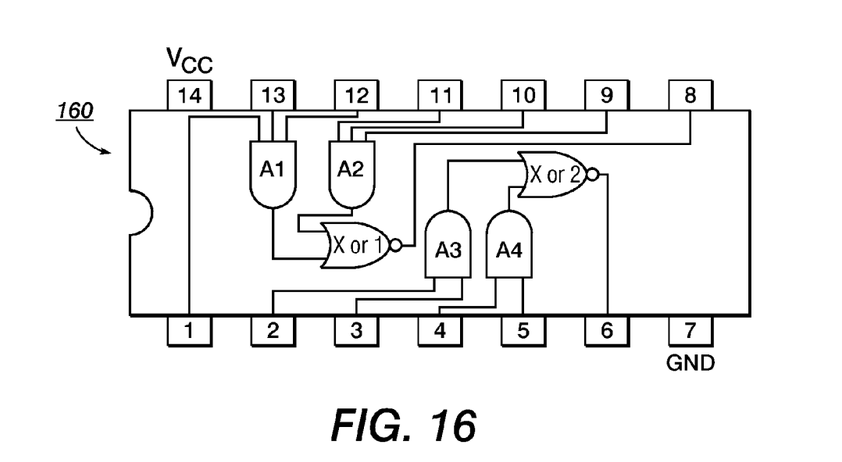
FIG. 16 illustrates 7451.

In this case, both pieces of logic would behave intermittently. The output of the first And-Or-Invert logic is no longer a true function of its inputs, but is also a function of the inputs of the second And-Or-Invert logic. In these cases, the IC is modeled at the gate level with node models which allow shorts. With node models, internal shorts appear as non-intermittent faults.

7 Algorithm

In connection with the following, a simplifying assumption is made that one set of shorts at a time are being viewed. All of the nodes which are shorted in any candidate diagnosis are considered shorted together. A simplistic implementation of node models would require the construction of $2^n+3n$ clauses for n-terminal nodes. Shorted nodes can have a large number of terminals. Therefore, a DEX according to the present concepts constructs these clauses only when they are needed to analyze a leading diagnosis using the consumer architecture of the HTMS.

Intuitively, the candidate generator which is used operates as follows: Candidate diagnoses are generated in best-first posterior probability order as in the GDE/Sherlock framework. The nodes are simply components. The used candidate generator is modified to not generate candidate diagnoses of only one shorted node. Whenever a new candidate diagnosis is identified with two or more shorted nodes, any needed additional clauses are added dynamically to model the combined set of shorted nodes. Clauses are added to ensure the signal levels at the shorted nodes are all equal (i.e., modeled as one node). One added circumscription clause disjoins the correct node model with the clause with all the U modes of all the possibly remaining shortable nodes in the current diagnosis. This added clause circumscribes the conditions under which the node model is applied to the node set. This is important to ensure that if the shorted set is ruled out as a diagnosis, that supersets may be considered as shorts without utilizing any additional clauses or inferential machinery. The best-first candidate generator focuses towards the most likely shorts, and does not generate candidate diagnoses which contain unlikely shorts. Thus, the probabilistic framework does the main work in avoiding considering exponentially many combinations of shorted nodes.

The presented algorithm for generating the best k diagnoses uses a variant of A*. For brevity only the basic algorithm is described, without optimizations and it does not include Bayes' rule updates of candidate posterior probability. The candidate diagnosis assigns a behavior mode to every component (including the nodes) of the system. Any GDE-style models which characterize only good behavior are modeled as "G" and "U." Assuming all components fail independently the prior probability of a particular candidate C, is:

$$p(C_l) = \prod_{m \in C_l} p(m),$$

where p(m) denotes the prior probability of behavior mode m. The objective of the algorithm is to discover the k most probable diagnoses (the "G" modes have higher priority probabilities than the "U" modes). To cast this search in the familiar A* framework, cost is defined as the negative sum of the logarithms of the fault mode probabilities. Every search node n is represented by a sequence of assignment of modes to components, including the empty model $\phi$ if that mode has not been assigned. Thus, $$g(n) = - \sum_{c=m \neq \phi \in n} \ln p(m),$$

$$h(n) = - \sum_{c=\phi \in n} \ln\max\{p(x) \mid x \in m(c)\},$$

where m(c) are the possible modes for component c. h clearly is an underestimate and thus admissible for A*. Algorithm 1, 170, of FIG. 17 describes the basic algorithm. CONSISTENT is a subprocedure which returns a conflict when the candidate is inconsistent, otherwise it succeeds.

Figure 17:
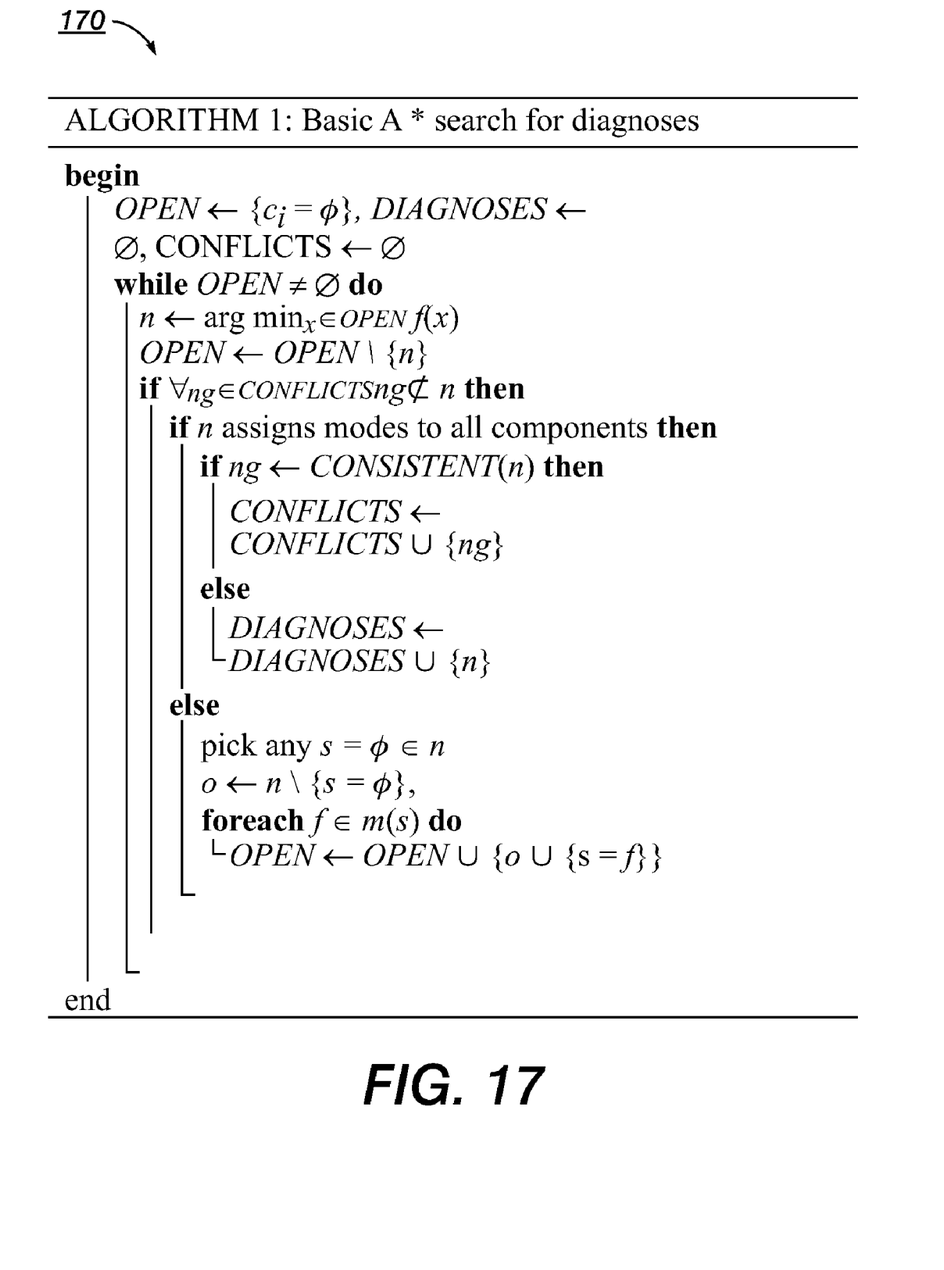
FIG. 17 shows Algorithm 1: Basic A* search for diagnoses.

All the axioms related to the described concepts of causality of Section 3 are included in the initial system description (SD). Nodes are just modeled as components, and the conventional model-based algorithm is adequate. The extension to model shorts requires a modification of the function CONSISTENT which adds the necessary shorted axioms relevant to any candidate diagnosis which is ultimately reached in the search. With this extension, the same algorithm identifies the highest probability candidates correctly. Nodes typically do not short independently—they short to each other. A more realistic prior probability of a candidate is:

$$p(C_l) = p(s_1, \ldots, s_k) \times \prod_{m \in \text{ components of } C_l} p(m),$$

where $p(s_1, \ldots, s_k)$ is the prior probability that nodes $s_1$ through $s_k$ are shorted together. To generalize the algorithm to shorts, only f and h need to be modified. Let $p^*(n)$ be the maximum probability of any shorts in search node n. This is computed from the assigned short modes as well as the unassigned node modes (which could be shorted). Then, $$g(n) = - \sum_{c=m \neq \phi \in n \wedge m \neq s} \ln p(m),$$

$$h(n) = - \sum_{c=\phi \in n} \ln\max\{x \mid x \in m(c)\} - \ln p^*(n).$$

As the additional term in h is derived from a maximum, it underestimates and the heuristic is admissible. The algorithm of FIG. 17 can be optimized and h and g better estimated.

DEX may use any of a number of probe-selection strategies including that described in J. de Kleer and B. C. Williams, "Diagnosing Multiple Faults", *Artificial Intelligence*, 32(1): 97-130, April 1987. Utilizing the A* algorithm with k=10 best diagnoses, the described embodiment can troubleshoot all structural failures (all opens and two-node-shorts) in all the circuits of the ISCAS-85 test suite in less than a minute on a modern PC. The troubleshooting task has become considerably more complex because there are now a far higher number of possible faults to distinguish among. Therefore the average number of measurements needed to isolate a fault is increased for every circuit.

8 Implementations

In this disclosure, the focus has been on identifying connection faults. This approach has been combined with the existing ability to replace components, repair nodes, select new measurements, and generate new test vectors. DEX can now perform these same tasks on circuits which contain connection faults.

A few of the possible applications to which the present concepts may be found useful, include modeling connections for diagnosis in the following areas. First, the present models presume that two nodes either short completely or do not influence each other directly (by far the prevalent fault model for digital circuits). Sometimes, however, the correct model lies in between—nodes could be shorted with a small resistance. Second, analog measurements may be used to track down shorts. Third, shorts may be used to change the dynamic behavior of a system (e.g., introduce oscillation). Fourth, connection faults being modeled could be intermittent.

The concepts disclosed herein and the notion of causal non-intermittency generalizes to other qualitative models. The concepts of sensed and driven variables and of using the best-probability first candidate generator can be combined to reason about structural faults in many domains (e.g., leaks or breaks in pipes and containers, additional linkages in mechanical systems) without incurring the computational complexity previous schemes require.

Figure 18:
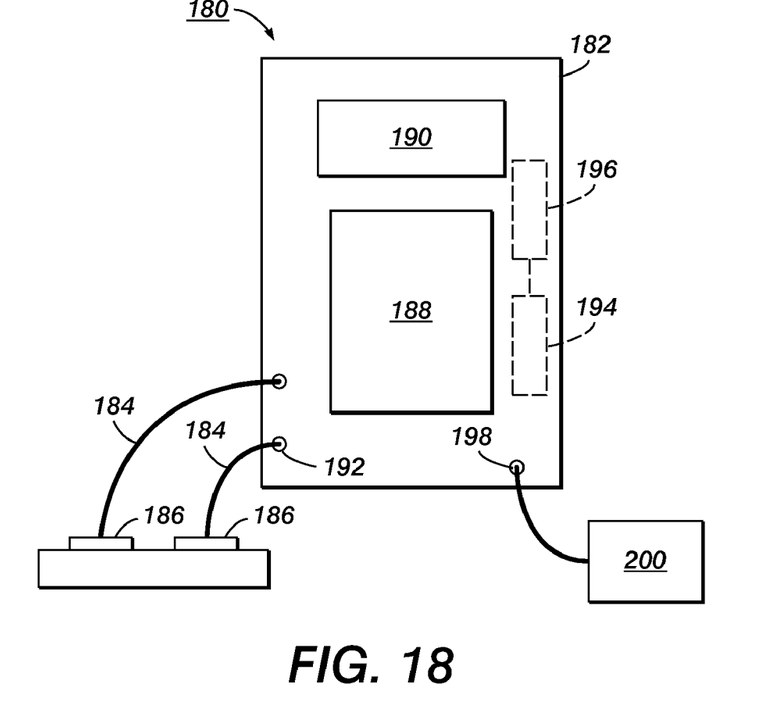
FIG. 18 is directed to one embodiment of a diagnostic device incorporating the concepts of the present application.

The preceding discussion focused on providing an improved system and method of modeling connections for a system under test in order to diagnose faults. Such diagnostic testing can be implemented in a wide range of areas. For example, as shown in FIG. 18, the DEX concepts disclosed in the present application may be embodied in a diagnostic device or system 180, including a body 182 and probes 184. Probes 184 are designed to be positioned in operative association with a device under test 186. Body 182 may include an input 188 and an output 190. The input 188 can include an alphanumeric keypad, stylus, voice, or other input design or interface known to input data or instructions. Output 190 may be any sort of display to display the results of a diagnostic investigation. Body 182 may also include a secondary set of inputs 192, wherein information detected by probes 184 are automatically input into diagnostic device 180.

It is to be understood that body 182 includes computational capabilities including at least a processor 194 and memory 196, which permits the processing of software code, including code incorporating the concepts described herein. Still further, diagnostic device or system 180 may include output 198, for connection to an output device 200 to permit the printing of hardcopies of output reports regarding the results of the diagnostic investigation.

It is to be appreciated the above description may be implemented on customized diagnostic devices, and/or may be included as part of hand-held computers, laptops, desktops or other computing devices, including personal digital assistants. Still further, the DEX implementing diagnostic device or system 180 is intended only as examples of how the concepts of the present application may be implemented.

In another embodiment, FIG. 18 may not include probes 184, but rather the diagnostics may be undertaken on computer software operating on the diagnostic device, or associated with another device having computational capabilities.

Figure 19:
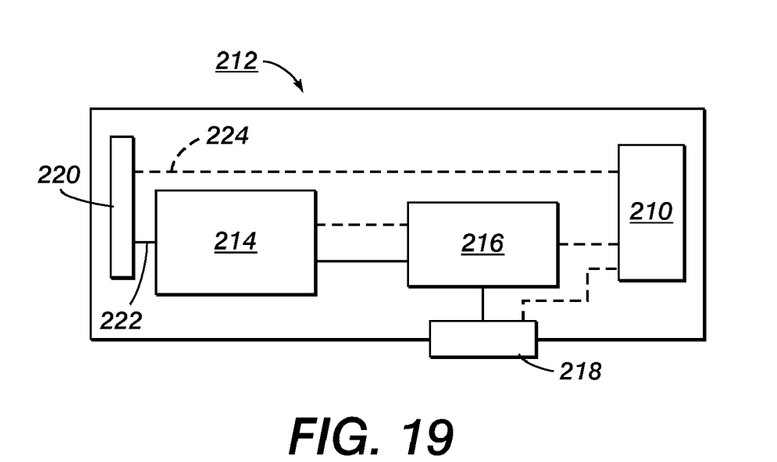
FIG. 19 is directed to an embodiment of an embedded diagnostic device.

In another embodiment illustrated in FIG. 19, the DEX implementing diagnostic device or system 210 is itself embedded as part of a larger overall system 212 which may, for example, include components 214-220 shown in operative connection with each other via solid lines 222. The diagnostic device or system 210, in turn is shown to be in operative connection with the components 214-220 via dotted lines 224. It is to be appreciated FIG. 19 is a high level example of a system in which a diagnostic device or system according to the present application may be used. The purpose of the diagnostic device or system 210 is to identify faults in the overall system 212 and initiate repairs without any human intervention. Examples of such overall systems would be reprographic equipment, automobiles, spacecraft, and airplanes, among others.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method for modeling connections of a system having a plurality of components and connections, the connections being located to connect the components to each other, the method comprising:
    modeling components of the system;
    modeling signal levels for nodes of the system as a variable, wherein the nodes of the system are representative of the connections; and
    modeling each potential component terminal connection of the connections which could potentially influence the signal level on each of the nodes as a qualitative variable, wherein each node of the system is modeled with n+1 variables, and the components which are modeled include devices which explicitly determine whether drive outputs can be directly modeled.

2. The method according to claim 1, wherein each component is considered a causal driver of a corresponding node.

3. The method according to claim 1, wherein the system is an electrical circuit.

4. The method according to claim 1, wherein opens, shorts and bridge faults of an electrical circuit are directly modeled.

5. The method according to claim 1, wherein modeling of faults are done within a GDE/Sherlock framework.

6. The method according to claim 1, wherein candidate diagnoses of potential faults are generated in a best-first order search arrangement, avoiding potential computational complexity introduced by more detailed causal models.

7. The method according to claim 6, wherein the candidates are ordered by posterior probabilities, not a number of faults they contain.

8. The method according to claim 1, wherein the modeling of the connections, models connections whose faults are joining faults.

9. The method according to claim 1, wherein the components include causal inputs and causal outputs.

10. The method according to claim 9, wherein,
    the causal inputs to the components are the signal levels at all the system nodes the components are connected to, and
    the causal outputs of the components are the driving signals on all of the connections of the nodes to which the components connect.

11. The method according to claim 10, wherein,
    a component is causally non-intermittent if all its driving outputs are a function of its sensed inputs.

12. The method according to claim 1, wherein the system is a mechanical system.

13. The method according to claim 12, wherein leaks in connections are directly modeled.

14. A method for modeling connections of a system having a plurality of components and connections, the connections being located to connect the components to each other, the method comprising:
    modeling components of the system;
    modeling signal levels for nodes of the system as a variable, wherein the nodes of the system are representative of the connections; and
    modeling each potential component terminal connection of the connections which could potentially influence the signal level on each of the nodes as a qualitative variable, wherein each node of the system is modeled with n+1 variables and a change in causality is represented by an increased complexity of the model having a worst case linear increase in the number of modeled components.

15. A computer program product for use with a computing device, the computer product comprising:
- a non-transitory computer readable medium that stores instructions, wherein when executed by a processor the instructions perform the following operations:
- modeling components of a system,
- modeling connections of the system having a plurality of components and connections, the connections being located to selectively connect the components to each other, the modeling of the connections including,
- modeling signal levels for nodes of the system as a variable, wherein the nodes of the system are representative of the connections; and
- modeling each potential component terminal connection of the connections which could potentially influence the signal level on each of the nodes as a qualitative variable, wherein each node of the system is modeled with n+1 variables, wherein the components which are modeled include devices which explicitly determine whether drive outputs can be directly modeled.

16. The computer product of claim 15, wherein each component is considered a causal driver of a corresponding node.

17. The computer product of claim 15, wherein the system is an electrical circuit.

18. The computer product of claim 15, wherein opens, shorts and bridge faults of an electrical circuit are directly modeled.

19. The computer product of claim 15, wherein the components include causal inputs and causal outputs.

20. The computer product of claim 19, wherein
- the causal inputs to the components are the signal levels at all the system nodes the components are connected to, and
- the causal outputs of the components are the driving signals on all of the connections of the nodes to which the components connect.

21. The computer product of claim 20, wherein,
- a component is causally non-intermittent if all its driving outputs are a function of its sensed inputs.

22. The computer product of claim 15, wherein the system is a mechanical system.

23. The computer product of claim 22, wherein leaks in connections are directly modeled.

* * * * *